(12) United States Patent
Kusumoto et al.

(10) Patent No.: US 6,444,506 B1
(45) Date of Patent: *Sep. 3, 2002

(54) METHOD OF MANUFACTURING SILICON THIN FILM DEVICES USING LASER ANNEALING IN A HYDROGEN MIXTURE GAS FOLLOWED BY NITRIDE FORMATION

(75) Inventors: Naoto Kusumoto; Toru Takayama; Masato Yonezawa, all of Kanagawa (JP)

(73) Assignee: Semiconductor Energy Laboratory Co., Ltd., Kanagawa-ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/735,680

(22) Filed: Oct. 23, 1996

(30) Foreign Application Priority Data

Oct. 25, 1995 (JP) ............................................. 7-302190
Nov. 1, 1995 (JP) ............................................. 7-308139

(51) Int. Cl.[7] ............................................. H01L 21/84
(52) U.S. Cl. ..................................... 438/151; 438/487
(58) Field of Search ................................. 438/151, 166, 438/308, 486, 762, 763, 775, 786, 791, 795, 798, FOR 155, FOR 184, FOR 200, FOR 448, 487

(56) References Cited

U.S. PATENT DOCUMENTS

| | | | | |
|---|---|---|---|---|
| 3,625,846 A | * | 12/1971 | Merdoch et al. | 204/157.45 |
| 4,309,225 A | * | 1/1982 | Fan et al. | 117/8 |
| 4,330,363 A | * | 5/1982 | Biegesen et al. | 117/43 |
| 5,008,211 A | * | 4/1991 | Yamazaki | 437/166 |
| 5,200,630 A | * | 4/1993 | Nakamura et al. | 257/66 |
| 5,306,651 A | * | 4/1994 | Masumo et al. | 148/91 |
| 5,313,076 A | * | 5/1994 | Zhang et al. | 257/347 |
| 5,488,000 A | * | 1/1996 | Zhang et al. | 438/166 |
| 5,534,445 A | * | 7/1996 | Tran | 438/166 |
| 5,550,070 A | * | 8/1996 | Funai et al. | 117/8 |
| 5,561,081 A | * | 10/1996 | Takenouchi et al. | 438/183 |
| 5,604,360 A | * | 2/1997 | Zhang et al. | 257/347 |
| 5,616,933 A | * | 4/1997 | Li | 257/57 |
| 5,620,910 A | * | 4/1997 | Teramoto | 438/151 |
| 5,648,276 A | * | 7/1997 | Hara et al. | 438/164 |
| 5,693,541 A | * | 12/1997 | Yamazaki et al. | 438/486 |
| 6,160,827 A | * | 12/2000 | Tanaka | 372/101 |

FOREIGN PATENT DOCUMENTS

| | | | | |
|---|---|---|---|---|
| JP | 2-55416 | * | 2/1990 | |
| JP | 2271611 A | * | 11/1990 | |
| JP | 2-271611 | * | 11/1990 | |
| JP | 3-30316 | * | 2/1991 | ........... H01L/21/20 |
| JP | 5-275652 | * | 10/1993 | |
| JP | 6-252170 | * | 9/1994 | |
| JP | 6-333823 | * | 12/1994 | |
| JP | 7-78996 | * | 3/1995 | |
| JP | 5-301338 | * | 5/1995 | |
| JP | 7-131031 | * | 5/1995 | |

OTHER PUBLICATIONS

Sera et al., "High Performance TFT's Fabricated by XeCl Excimer Laser Annealing of Hydrogenated Amorphous–Silicon Film", 1989, IEEE, pp. 2868–2872.*
Zhang et al., "KrF Excimer Laser Annealed TFT with Very High Field–Effect Mobility", 1992, IEEE, pp. 297–299.*
Akasaka et al., "Fabrication of High Quality Polysilicon Thin Film On Glass And Its In Situ Real–Time Monitoring By Spectroscopic Ellipsometry", First World Conference Photovoltaic Energy Conversion, 1994, Conference Record of the Twenty Fourth IEEE Photo, Dec. 1994.*
Sera et al., "High–Performance TFT's Fabricated by XeCl Excimer Laser Annealing of Hydrogenated Amorphous–Silicon Film", IEEE Transactions on Electron Devices, vol. 36, No. 12, pp. 2868–2872, Dec. 1989.*
Brotherton et al., "Excimer–Laser–Annealed Poly–Si thin–Film Transistors", IEEE Transactions on Electron Devices, vol. 40, No. 2, pp. 407–413, Feb. 1993.*
Wallace et al., "Amorphous and Micro–Crystalline Silicon for Photovoltaic Application", IEEE Transactions on Electron Devices, pp. 977–978, 1993.*
Nakamura et al., "The Roles of Atomic Hydrogen Played in the Chemical Annealing for Fabrication of a–Si:H", 1994 IEEE First World Conference on Photovoltaic Energy Conversion, Conference Record of the Twenty Fourth IEEE Photovoltaic Specialists Conference, Dec. 1994.*
Kohno et al., "High Performance Poly–Si TFTs Fabricated Using Pulsed Laser Annealing and remote Plasma CVD with Low Temperature Processing", IEEE Transactions on Electron Devices, vol. 42, No. 2, pp. 251–257, Feb. 1995.*
Kohno et al., "High Performance Poly–Si TFTs Using Pulsed Laser Annealing and Remote Plasma CVD with Low Temperature Processing", Feb. 1995, IEEE Transactions on Electron Devices, vol. 42, No. 2, pp. 251–257.*
Brotherton et al., "Excimer–Laser–Annealed poly–Si Thin–Film Transistors", Feb. 1993, IEEE transactions on Electron Devices, vol. 40, No. 2, pp. 407–413.*
Zhang et al., "KrF Excimer Laser Aneealed TFT with Very High Field–Effect Mobility of 329 cm2/Vs", May 1992, IEEE Electron Device Letters, vol. 13, No. 5, pp. 297–299.*
Sera et al., "High–Performance TFTs Fabricated by XeCl Excimer Laser Annealing of Hydrogenated Amorphous–Silicon Film", Dec. 1989, IEEE Transactions on Electron Devices, vol. 36, No. 12, pp. 2868–2872.*

* cited by examiner

Primary Examiner—Michael J. Sherry
Assistant Examiner—Evan Pert
(74) Attorney, Agent, or Firm—Fish & Richardson P.C.

(57) ABSTRACT

A crystalline silicon film is obtained by laser-annealing a non-single-crystal silicon film by illuminating it with a laser beam in a hydrogen-inclusive atmosphere. Further, the above laser annealing step and a step of forming an insulating film to become a gate insulating film are performed consecutively. As a result, hydrogen is effectively confined in a channel forming region and the boundary between the channel forming region and the gate insulating film is given superior characteristics, which lead to proper threshold voltage control, a reduction in S-value, and an increase in mobility. The hydrogen confinement can be made more effective by employing a silicon nitride film or a multi-layer film including a silicon nitride film as the insulating film to become the gate insulating film.

75 Claims, 8 Drawing Sheets

METHOD OF MANUFACTURING SILICON THIN FILM DEVICES USING LASER ANNEALING IN A HYDROGEN MIXTURE GAS FOLLOWED BY NITRIDE FORMATION

BACKGROUND OF THE INVENTION

1. Field of the Invention

The present invention relates to a method for manufacturing a thin-film transistor using a crystalline silicon film.

The invention also relates to a process to crystallize or improve the crystallinity of an amorphous silicon film or a crystalline silicon film formed on an insulating substrate such as a glass substrate by laser annealing.

The invention also relates to threshold voltage control on a thin film transistor that is formed by using a crystalline silicon film.

2. Description of the Related Art

In recent years, extensive studies have been made of the techniques of crystallizing or improving the crystallinity of an amorphous silicon film or a crystalline silicon film (a silicon film that is not a single crystal but is polycrystalline, microcrystalline, or in some other form of crystallinity), formed on an insulating substrate such as a glass substrate by laser annealing.

Having a large mobility, a crystalline silicon film formed through laser annealing is widely used in a monolithic liquid crystal electrooptical device etc. in which thin-film transistors (TFTs) for a pixel region (pixel driving) and driver circuits are formed by using the crystalline silicon film on a single glass substrate, for instance.

On the other hand, because it can provide high productivity and hence is superior from the industrial viewpoint, a laser annealing method is used by preference. In the laser annealing method, a high-power pulse laser beam emitted from an excimer laser or the like is processed by an optical system to assume a several centimeter square spot or a linear shape of several millimeters in width and several tens of centimeters in length on an irradiation surface and the irradiation surface is scanned with the laser beam (the laser beam illuminating position is moved relatively to the irradiation surface).

In particular, the use of a linear laser beam is advantageous in obtaining high productivity, because in many cases the entire irradiation surface can be subjected to laser light irradiation by scanning in only one direction that is perpendicular to the beam longitudinal direction in l o contrast to the case of using a spot-like laser beam which requires two dimensional scanning.

A TFT using a crystalline silicon film, if a crystalline silicon film constituting the channel forming region is intrinsic, has a general tendency that the threshold voltage is slightly shifted to the negative side of 0 V and the current-rising voltage is about −2 to −4 V in the case of an n-channel transistor. As a result, there is a marked tendency that the TFT has a normally-on state (it is in an on state even if the gate voltage is 0 V).

When a TFT having a normally-on state is used as a switching element, for instance, current flows through it even if the gate voltage is 0 V. The gate voltage needs to be always biased to the positive side to render the switch in an off state. Therefore, a circuit using such TFTs has various problems such as high current consumption and the necessity of a circuit for applying a bias voltage.

To solve the above problems, threshold voltage control is conventionally performed in which even in the case of producing an n-channel TFT, a crystalline silicon film constituting a channel forming region is doped with a p-type impurity, for instance, boron, to shift the threshold voltage to the positive side. A resulting TFT has a normally-off state (it is off when the gate voltage is 0 V). However, causing an increase in the number of manufacturing steps, the threshold voltage control is a factor of preventing reduction in manufacturing cost.

SUMMARY OF THE INVENTION

An object of the present invention is to shift the threshold voltage of a TFT using a crystalline silicon film to the positive side, thereby causing an n-channel TFT to exhibit a normally-off state.

Another object of the invention is to reduce the S-value and increase the mobility.

To attain the above objects, according to a first aspect of the invention, there is provided a manufacturing method of a semiconductor device comprising a first step of laser-annealing a non-single-crystal silicon film that is formed on a substrate having an insulating surface in a hydrogen-inclusive atmosphere; and a second step of forming an insulating film to become a gate insulating film on the non-single-crystal silicon film, the first and second steps being performed consecutively.

In the above manufacturing method, it is preferred that the non-single-crystal silicon film not be exposed to the air between the first and second steps.

According to a second aspect of the invention, there is provided a manufacturing method of a semiconductor device comprising the steps of preparing a consecutive processing apparatus having a laser irradiation chamber, a substrate transfer chamber, and a processing chamber, the respective chambers being airtight; laser-annealing a non-single-crystal silicon film that is formed on a substrate having an insulating surface in a hydrogen-inclusive atmosphere in the laser processing chamber; transferring the substrate to the processing chamber via the substrate transfer chamber; and forming an insulating film to become a gate insulating film on the non-single-crystal silicon film in the processing chamber.

In the above manufacturing method, it is preferred that the insulating film be a silicon nitride film or a multi-layer film including a silicon nitride film.

It is preferred that the multi-layer film include a silicon oxynitride film formed on the non-single-crystal silicon film and a silicon nitride film formed on the silicon oxynitride film.

It is preferred that the multi-layer film include a silicon oxide film formed on the non-single-crystal silicon film and a silicon nitride film formed on the silicon oxide film.

It is preferred that the multi-layer film include a first silicon nitride film formed by nitrifying a surface of the non-single-crystal silicon film and a second silicon nitride film formed on the first silicon nitride film.

In this specification, the term "consecutive" means that there is no step that changes the composition, film quality, shape, or structure of a non-single-crystal silicon film that has just been subjected to the first step, between the first and second steps.

Therefore, providing, between the first and second steps, a substrate transfer step, an alignment step, a slow cooling step, a step of heating a substrate to a temperature suitable for the second step, or a like step is within the scope of the term "consecutive" as used in this specification.

On the other hand, providing, between the first and second steps, a step of exposing a non-single-crystal silicon film to a particular atmosphere (for instance, an oxidizing atmosphere) that changes its film quality, a heating step (for instance, a heating step intended for hydrogen removal, or a heating step performed in an oxidizing atmosphere or the like) to intentionally change the film quality of a non-single-crystal silicon film, an ion doping step, a film formation step, an etching step, a plasma processing step, a coating application step, or a like step is not included in the scope of the term "consecutive" as used in this specification.

In the invention, in crystallizing or improving the crystallinity of a non-single-crystal silicon film by laser annealing, the non-single crystal silicon film is irradiated with laser light in a hydrogen-inclusive atmosphere.

A TFT formed by using a crystalline silicon film that has been obtained by laser-annealing a non-single-crystal silicon film in a hydrogen-inclusive atmosphere exhibits a positive threshold voltage shift of about 2 to 4 V and a current-rising voltage of about 0 V or larger, in both cases of an n-channel and p-channel TFTs. The reason for these phenomena is unknown.

Therefore, the conventional step of controlling the threshold voltage by boron doping can be eliminated.

There is a tendency that the positive shift of the threshold voltage becomes larger as the hydrogen concentration of an atmosphere in the laser annealing step increases. Therefore, it is possible to control the degree of the threshold voltage shift by the hydrogen concentration of the atmosphere.

In this manner, the threshold voltage control can be performed in a TFT manufacturing process without introducing a new step. Therefore, compared to the conventional threshold voltage control by boron doping, the TFT manufacturing process can be simplified and the manufacturing cost can be reduced.

In addition, even if the threshold voltage is shifted by laser annealing in a hydrogen-inclusive atmosphere, the current-rising performance in the current-voltage characteristic of a TFT, which is represented by the S-value (V/decade), shows almost no change; that is, the shift of the threshold voltage causes almost no increase in S-value (almost no deterioration in rising performance). That is, threshold voltage shift causes almost no deterioration in the current-rising performance at the time of switching of a TFT.

Thus, by performing laser annealing in a hydrogen-inclusive atmosphere, a non-single-crystal silicon film can be crystallized or improved in crystallinity, as well as the threshold voltage of a TFT formed by using a resulting crystalline silicon film can be shifted to the positive side without increasing the S-value. Therefore, a TFT that shows superior current rising performance at the time of switching and hence exhibits a normally-off state can be obtained without increasing the number of manufacturing steps.

Further, the above laser annealing in a hydrogen-inclusive atmosphere is employed as the first step, and a step of forming an insulating film to become a gate insulating film on the non-single crystal silicon film is employed as the second step. By performing the first and second steps consecutively, the insulating film to become the gate insulating film can be formed in a state that very little change has occurred in the non-single-crystal silicon film after the first step.

Therefore, the removal of hydrogen, which was introduced in the non-single-crystal silicon film during the laser annealing in a hydrogen-inclusive atmosphere and neutralizes or compensates for dangling bonds of silicon, can be reduced to a very low level, whereby hydrogen can be confined in the channel forming region of the silicon film more effectively.

As a result, the positive threshold voltage shift is increased. Further, the mobility is increased because the number of dangling bonds in the channel forming region is decreased.

Further, the boundary between the channel forming region and the gate insulating film is given superior characteristics, leading to a reduction in S-value.

In addition, avoiding exposure to the air of the non-single-crystal silicon film after the first step is effective in preventing formation of an oxide film on the non-single-crystal silicon film and adhesion of impurities thereto.

As a result, the degree of formation, at the boundary, of an oxide film and impurities, which are factors of generating traps, can be reduced, whereby a reduction in S-value and an increase in mobility can be obtained, the possibility of occurrence of the threshold voltage instability caused by impurity ions can be reduced.

To perform the first and second steps consecutively, i.e., without exposing a non-single-crystal semiconductor film to the air, it is effective to use a multi-chamber consecutive processing apparatus in which a chamber for performing laser annealing and chambers for forming an insulating film are connected to each other via an airtight substrate transfer chamber.

Further, because of an enhanced hydrogen confining effect, it is effective to form a multi-layer film including a silicon nitride film on the non-single crystal film as the gate insulating film.

It is preferred that the multi-layer film containing a silicon nitride film be formed such that a silicon nitride film is formed on a silicon oxide film, on a silicon oxynitride film, or on a silicon nitride film obtained by nitrifying the surface of the non-single-crystal semiconductor film.

The insulating film may be constituted only of a silicon nitride film. However, in this case, the threshold voltage of a resulting thin-film transistor is less stable with respect to a temperature variation as compared with the case of using the multi-layer film.

To perform laser annealing in a hydrogen-inclusive atmosphere, a laser annealing apparatus is used which performs laser annealing on a non-single-crystal silicon film in a laser irradiation chamber capable of atmosphere control, and which is equipped with a means for supplying at least hydrogen to the laser irradiation chamber.

It is preferred that the hydrogen-inclusive atmosphere is a mixed gas of hydrogen and air or an inert gas such as nitrogen, helium, or argon.

It is preferred that the hydrogen-inclusive atmosphere contain hydrogen at more than 1 ppm at the atmospheric pressure. It is even preferred that the hydrogen content be more than 0.1%. It is best that the hydrogen content be more than 1%.

In particular, it is preferred that the purity of each of hydrogen and an inert gas that constitute the hydrogen-inclusive atmosphere be more than 99.9% (3 Ns) and less than 99.99999% (7 Ns). By using the atmosphere constituted of gases whose purity is in this range, it is possible to produce crystalline silicon films that are stable in film quality and TFT characteristics. If the purity of hydrogen and an inert gas that constitute the atmosphere is lower than 3 Ns, the film quality and the TFT characteristics likely become unstable due to impurities in the atmosphere, such as carbon, water, and hydrogen carbides. On the other hand, even if the purity is higher than 7 Ns, no remarkable improvement is found, though a cost increase is incurred. This is the reason why a purity level higher than 7 Ns is not preferred.

The laser annealing may be performed at the atmospheric pressure. However, it is preferred that the laser annealing be performed at a pressure lower than the atmospheric pressure, particularly at 0.01 to 700 Torr, because the degree of roughness of the top surface of a crystalline silicon film or the entire film due to plural times of irradiation with pulse laser beams can be lowered. That is, with improved resistance to pulse laser beams, a resulting film is low in the degree of roughness. If the laser annealing pressure is higher than 700 Torr, the degree of roughness of a resulting film is practically same as the case of the atmospheric pressure. On the other hand, if the pressure is lower than 0.01 Torr, almost no threshold voltage shift due to the use of the hydrogen-inclusive atmosphere is obtained.

It is preferred that an irradiation surface is scanned with a laser beam whose sectional shape on the irradiation surface is spot-like or linear.

Further, it is preferred that a pulsed laser is used as a laser beam light source.

In another aspect, a manufacturing method of a semiconductor device includes introducing impurities in a semiconductor layer comprising silicon formed over a substrate, and scanning the substrate having the semiconductor layer with a pulsed linear laser beam having an elongated cross section by moving the substrate in a direction perpendicular to an elongation direction of the cross section at a fixed speed at an atmospheric pressure. One point of the substrate is irradiated with 20 to 40 pulses of the laser beam.

In a further aspect, the method includes forming a crystalline semiconductor layer comprising silicon over a substrate, and forming a gate electrode adjacent to the semiconductor layer with a gate insulating film interposed therebetween.

In a still further aspect, the method includes scanning a semiconductor layer comprising silicon over a substrate, with a pulsed linear laser beam having an elongated cross section by moving the substrate in a direction perpendicular to an elongation direction of the cross section at a fixed speed. One point of the substrate is irradiated with 10 to 50 pulses of the laser beam.

DETAILED DESCRIPTION OF THE PREFERRED EMBODIMENTS

Embodiment 1

This embodiment is directed to a laser annealing process in a hydrogen atmosphere.

FIGS. 2A to 2F show a manufacturing process according to this embodiment. First, a 2,000-Å-thick silicon oxide film 202 as an undercoat film is formed on a 127-mm-square Corning 1737 substrate 201 by plasma CVD. Immediately thereafter, a 500-Å-thick amorphous silicon film is formed thereon also by plasma CVD.

Next, a nickel acetate layer is formed by applying a 10-ppm nickel acetate aqueous solution to the amorphous silicon film through spin coating. It is preferred to add a surfactant to the nickel acetate aqueous solution. Although the nickel acetate layer does not necessarily assume a film form because it is very thin, this fact does not cause any problems in the subsequent steps.

Figure 2A:
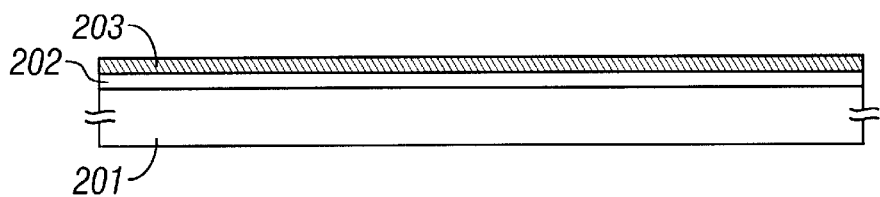
FIGS. 2A through 2F show a manufacturing process according to the first and second embodiments.

Next, the substrate 201 on which the respective films have been laid one on another in the above manner is subjected to thermal annealing of 600° C. and 4 hours. Thus, the amorphous silicon film is crystallized into a crystalline silicon film 203. (FIG. 2A)

During the course of the annealing, nickel, which is a catalyst element, serves as nuclei of crystal growth and thereby accelerates the crystallization. It is due to the function of nickel that the crystallization can be effected at as low a temperature as 600° C. and in as short a time of 4 hours. Details are described in Japanese Patent Laid-Open No. 6-244104.

It is preferred that the concentration of the catalyst element is $1\times10^{15}$ to $1\times10^{19}$ atoms/cm$^3$. If the concentration is higher than $1\times10^{19}$ atoms/cm$^3$, metal properties appear, that is, semiconductor properties disappear, in the crystalline silicon film. In this embodiment, the concentration of the catalyst element in the crystalline silicon film is $1\times10^{17}$ to $5\times10^{18}$ atoms/cm$^3$ in terms of a minimum value within the film as analyzed and measured by secondary ion mass spectrometry is (SIMS).

To improve the crystallinity of the resulting crystalline silicon film 203, laser annealing is performed by using an excimer laser.

Figure 1:
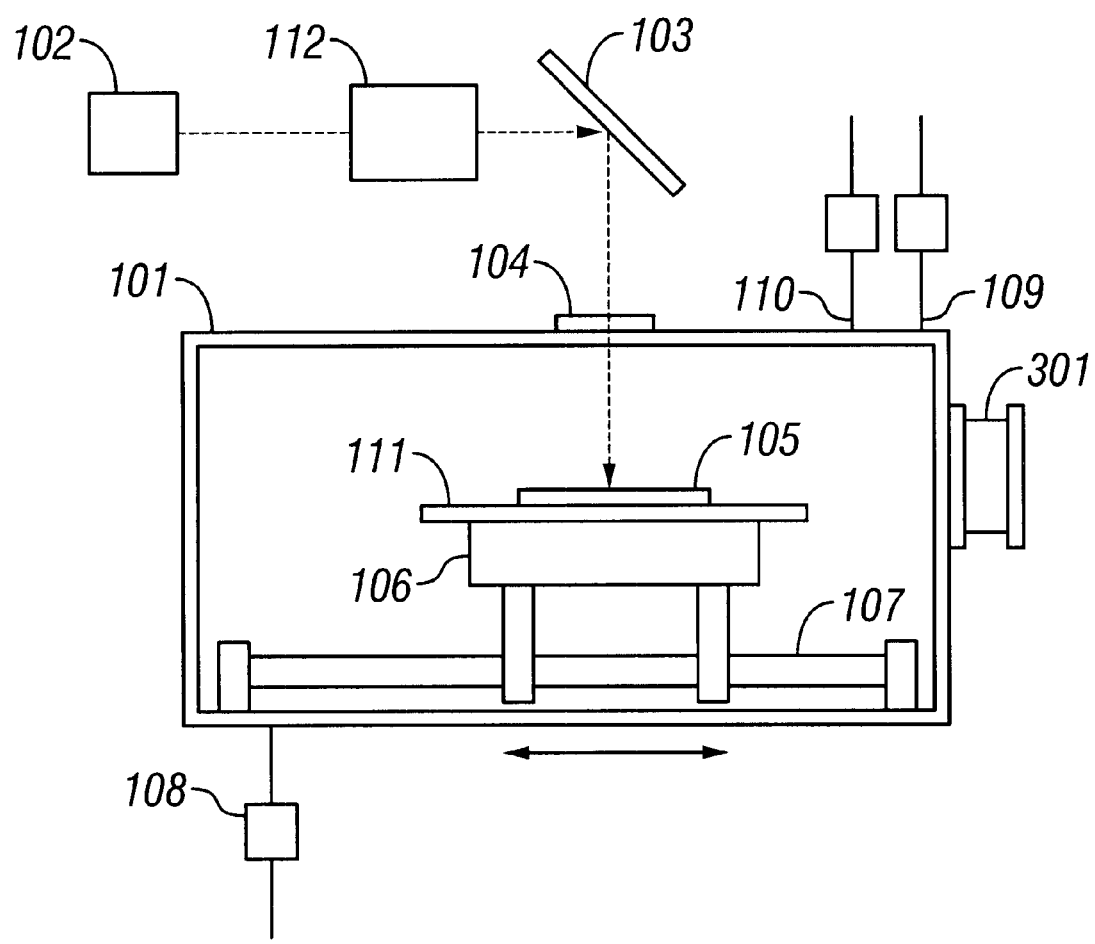
FIG. 1 shows a laser irradiation chamber used in embodiments of the present invention.
Figure 3:
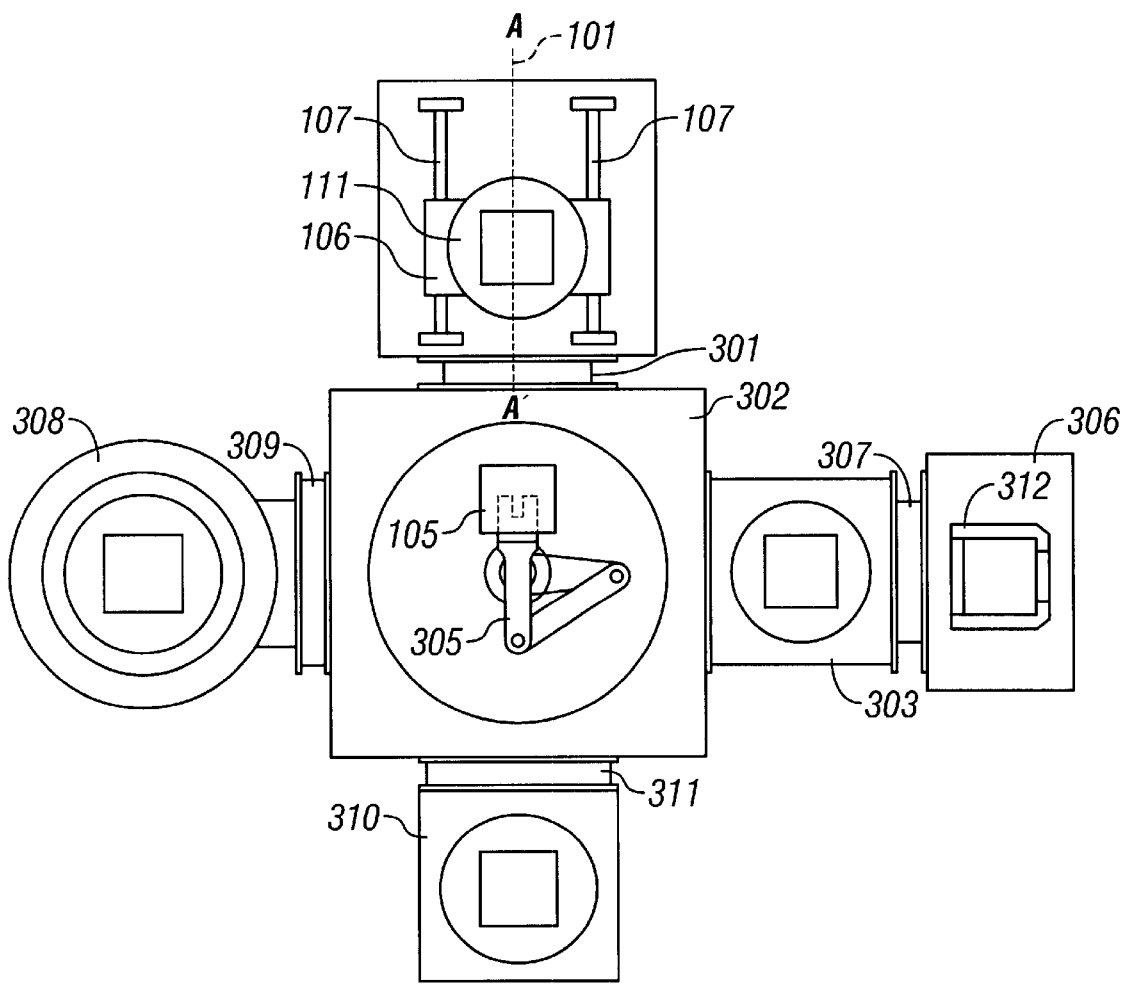
FIG. 3 is a top view of a laser annealing apparatus used in the first and second embodiments.

FIG. 1 is a side sectional view of a laser irradiation chamber used in this embodiment. FIG. 3 is a top view of a multi-chamber laser annealing apparatus used in this embodiment. FIG. 1 is a sectional view taken along line A–A' in FIG. 3.

Referring to FIG. 1, in a laser irradiation chamber 101, a pulse light beam is emitted from a laser oscillation device 102, and then processed by an optical system 112 so as to assume a linear sectional shape. The pulse laser beam is then reflected by a mirror 103, and finally applied to a substrate 105 to be processed through a quartz window 104.

In this embodiment, the laser oscillation device 102 is a XeCl excimer laser (wavelength: 308 nm). A KrF excimer laser (wavelength: 248 nm) may also be used.

The substrate 105 to be processed is mounted on a stage 111, and kept at a given temperature (1000 to 700° C.) by means of a heater that is incorporated in a base 106.

The base 106 is moved by a moving mechanism 107 perpendicularly to the longitudinal direction of the linear laser beam, to allow the top surface of the substrate 105 to be irradiated and scanned with the laser beam.

The laser irradiation chamber 101 capable of atmosphere control has a vacuum pump 108 as a pressure reducing means (evacuation means). The laser irradiation chamber 101 further has, as a gas supply means, a gas supply duct 109 that is connected to a hydrogen cylinder via a valve and a gas supply duct 110 that is connected to a cylinder of nitrogen or some other gas via a valve.

As shown in FIG. 3, the laser irradiation chamber 101 of FIG. 1 is connected to a substrate transfer chamber 302 via a gate valve 301.

Referring to FIG. 3, the laser irradiation apparatus will be described below. A cassette 312 accommodating a number of, for instance, 20, substrates 105 to be processed is placed in a load/unload chamber 306. One substrate is transferred from the cassette 312 to an alignment chamber 303 by a robot arm 305.

The alignment chamber 303 is equipped with an alignment mechanism for correcting the positional relationship between the substrate 105 and the robot arm 305. The alignment chamber 303 is connected to the load/unload chamber 306 via a gate valve 307.

In a preliminary heating chamber 308, substrates to be subjected to laser annealing are preliminarily heated to a given temperature to shorten the time that is taken to heat a substrate in the laser irradiation chamber 101, to thereby increase the throughput.

The inside of the preliminary heating chamber 308 is constituted by a quartz cylinder, which is surrounded by heaters. The preliminary heating chamber 308 is equipped with a substrate holder made of quartz, which has a susceptor capable of accommodating a number of substrates. The substrate holder can be moved vertically by an elevator. The substrates are heated by the heaters. The preliminary heating chamber 308 is connected to the substrate transfer chamber 302 via a gate valve 309.

A substrate that has been preliminarily heated for a given time in the preliminary heating chamber 308 is returned to the substrate transfer chamber 302 by the robot arm 305, then subjected to alignment in the alignment chamber 303, and transferred to the laser irradiation chamber 101 by the robot arm 305.

After being subjected to the laser light irradiation, the substrate 105 is returned to the substrate transfer chamber 302 by the robot arm 305, and then transferred to a slow cooling chamber 310.

The slow cooling chamber 310 is connected to the substrate transfer chamber 302 via a gate valve 311. In the slow cooling chamber 310, the substrate 105 mounted on a quartz stage is gradually cooled while being irradiated with infrared light coming from lamps and reflecting plates.

After gradually cooling, the substrate 105 is transferred to the load/unload chamber 306 by the robot arm 305 and stored into the cassette 312.

Thus, the laser annealing operation on one substrate is completed. A number of substrate can be processed consecutively one by one by repeating the above steps.

Next, a description will be made of a laser annealing process using the apparatus of FIGS. 1 and 3. First, a substrate 105 to be processed (i.e., the substrate 201 having the crystalline silicon film 203) is cleaned with a HF aqueous solution or an aqueous solution of HF and $H_2O_2$ so that a native oxide film is removed. The substrate 105 is then set in the cassette 312, which is then placed into the load/unload chamber 306.

Referring to FIG. 3, in this embodiment, the substrate 105 that has been subjected to alignment is directly transferred to the laser irradiation chamber 101 without being transferred to the preliminary heating chamber 308 to prevent oxidation due to exposure to the air in the chamber 308. However, it is effective to heat the substrate 105 in the preliminary heating chamber 308 to such a degree that its top surface is not oxidized. The heating in the preliminary heating chamber 308 may be performed in a non-oxidizing atmosphere such as a nitrogen atmosphere.

After the laser irradiation chamber 101 is evacuated by the vacuum pump 108, hydrogen and nitrogen are introduced into the chamber 101 from the respective gas supply ducts 109 and 110 to provide an atmosphere consisting of hydrogen of 3% and nitrogen of 97%. In this embodiment, the purity of each of hydrogen and nitrogen that are introduced into the laser irradiation chamber 802 is 99.99999% (7 Ns). The pressure is maintained at the atmospheric pressure.

The substrate 105 that has been transferred to the laser irradiation chamber 101 and is now mounted on the stage 111 is heated to 200° C. by the heater that is incorporated in the base 106.

Referring to FIG. 1, a linear laser beam to be applied to the substrate 105 is 0.34 mm in width and 135 mm in length. The energy density of the laser beam on the irradiation surface is 100 to 500 mJ/cm$^2$, for example, 260 mJ/cm$^2$. The substrate 105 is scanned with the linear laser beam by moving the base 106 in one direction at 2.5 mm/s. The laser oscillation frequency is set at 200 Hz. One point of the substrate 105 is irradiated with 10 to 50 shots of laser beams.

Figure 2B:
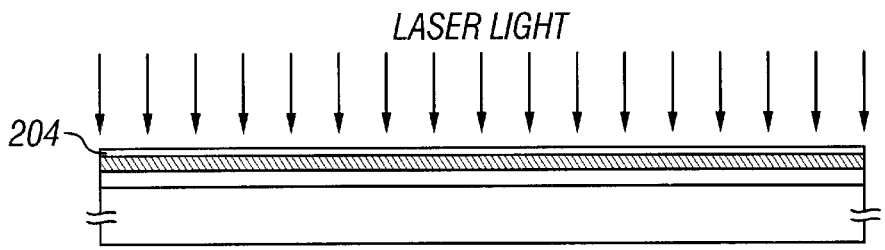
Figure 2C:
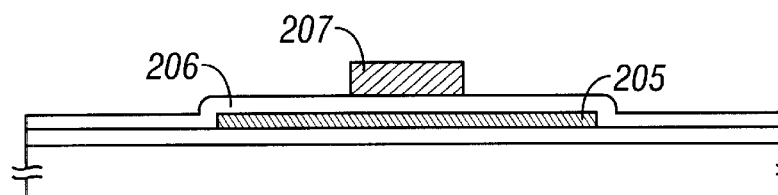

The crystalline silicon film 203 is laser-annealed in the above manner, and its crystallinity is improved. (FIG. 2B)

The laser annealing in a hydrogen-inclusive atmosphere may be performed at a low pressure, in particular, 0.01 to 700 Torr, rather than at the atmospheric pressure. By performing the laser annealing at such a low pressure, the degree of roughness of the surface and the entire film of the annealed crystalline silicon film can be reduced.

Thereafter, the substrate 105 is transferred to the slow cooling chamber 310. After being gradually cooled therein, the substrate 105 is stored into the cassette 312 of the load/unload chamber 306, which is then taken out of the laser annealing chamber.

Next, a TFT is formed by using the crystalline silicon film 203 thus formed. First, the crystalline silicon film 203 is etched into an island-like region 205.

Then, a 1,200-Å-thick silicon oxide film as a gate insulating film 206 is formed through plasma CVD by using material gases of TEOS and oxygen. During the film formation, the substrate temperature is maintained at 250° to 380° C., for instance, 300° C.

A gate electrode is then formed. That is, an aluminum film is deposited through sputtering at a thickness of 3,000 to 8,000 Å, for instance, 6,000 Å. Silicon may be added to the aluminum film at 0.1% to 2%. The aluminum film is etched into a gate electrode 207. (FIG. 2C) Next, impurities are introduced in the following manner. In case of forming an n-channel TFT, phosphorus ions are implanted into the island-like region 205 by ion doping with the gate electrode 207 used as a mask. Phosphine ($PH_3$) is used as a doping gas. The acceleration voltage is set at 10 to 90 kV, for instance, 80 kV. The dose amount is set at $1\times10^{14}$ to $5\times10^{15}$ atoms/cm$^2$, for instance, $1\times10^{15}$ atoms/cm$^2$. The substrate temperature is maintained at the room temperature. As a result, a channel forming region 210 and n-type impurity regions, i.e., a source 208 and a drain 209 are formed.

Figure 2D:
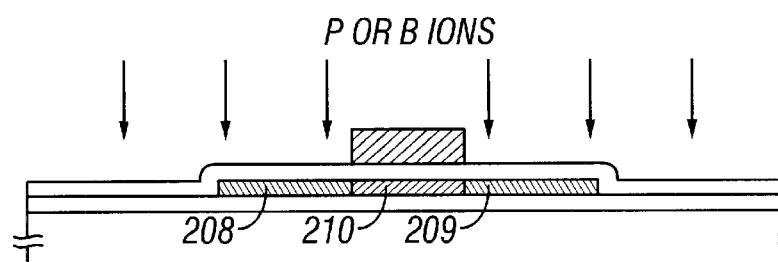

In case of forming a p-type TFT, boron ions are implanted into the island-like region 205 by ion doping with the gate electrode 207 used as a mask. Diborane ($B_2H_6$) that is diluted by hydrogen to 1% to 10%, for instance, 5%, is used as a doping gas. The acceleration voltage is set at 60 to 90 kV, for instance, 65 kV. The dose is set at $2\times10^{15}$ to $5\times10^{15}$ atoms/cm$^2$, for instance, $3\times10^{15}$ atoms/cm$^2$. The substrate temperature is maintained at the room temperature. As a result, a channel forming region 210 and p-type impurity regions, i.e., a source 208 and a drain 209 are formed. (FIG. 2D)

Figure 2E:
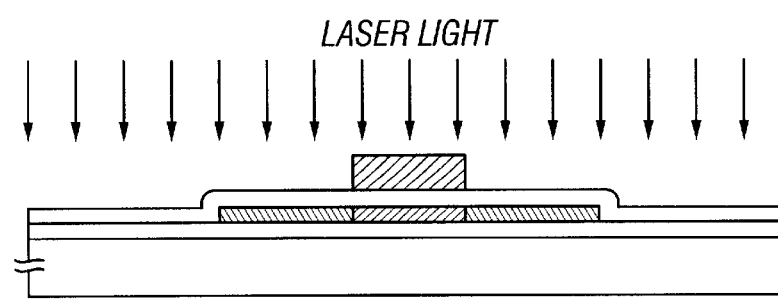

Next, to activate the doped impurities, laser annealing is performed with a linear laser beam by again using the laser annealing apparatus of FIG. 3. An air atmosphere (atmospheric pressure) is established in the laser irradiation chamber 101. The energy density of a laser beam on the irradiation surface is set at 100 to 350 mJ/cm$^2$, for instance, 160 mJ/cm$^2$. The substrate is scanned with linear laser beams such that one point of the substrate is irradiated with 20 to 40 shots of laser beams. The substrate temperature is set at 200° C. After the laser light irradiation, thermal annealing is performed at 450° C. for 2 hours in a nitrogen atmosphere. (FIG. 2E)

Subsequently, a 6,000-Å-thick silicon oxide film as an interlayer insulating film 211 is formed through plasma CVD. Contact holes are then formed through the interlayer insulating film 211 by etching.

Further, a source electrode/wiring line 212 and a drain electrode/wiring line 213 are formed through the contact holes by forming and then etching a metal film such as a multi-layer film of titanium and aluminum.

Finally, thermal annealing is performed at 2000 to 350° C. in a hydrogen atmosphere of 1 atm.

Figure 2F:
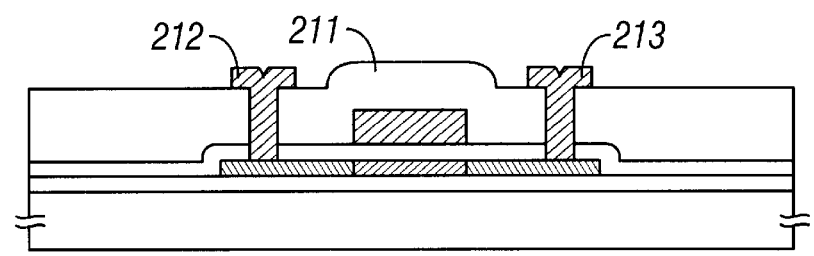

A plurality of n-channel TFTs or p-channel crystalline TFTs are formed in the above manner. The mobility of resulting TFTs is as large as 70 to 120 cm$^2$/V.s (n-channel type) and 60 to 90 cm$^2$/V.s (p-channel type). (FIG. 2F)

TFTs were formed according to the above method in which the atmosphere in the laser annealing and the energy density of a laser beam were varied. Resulting characteristics will be compared below.

Figure 4A:
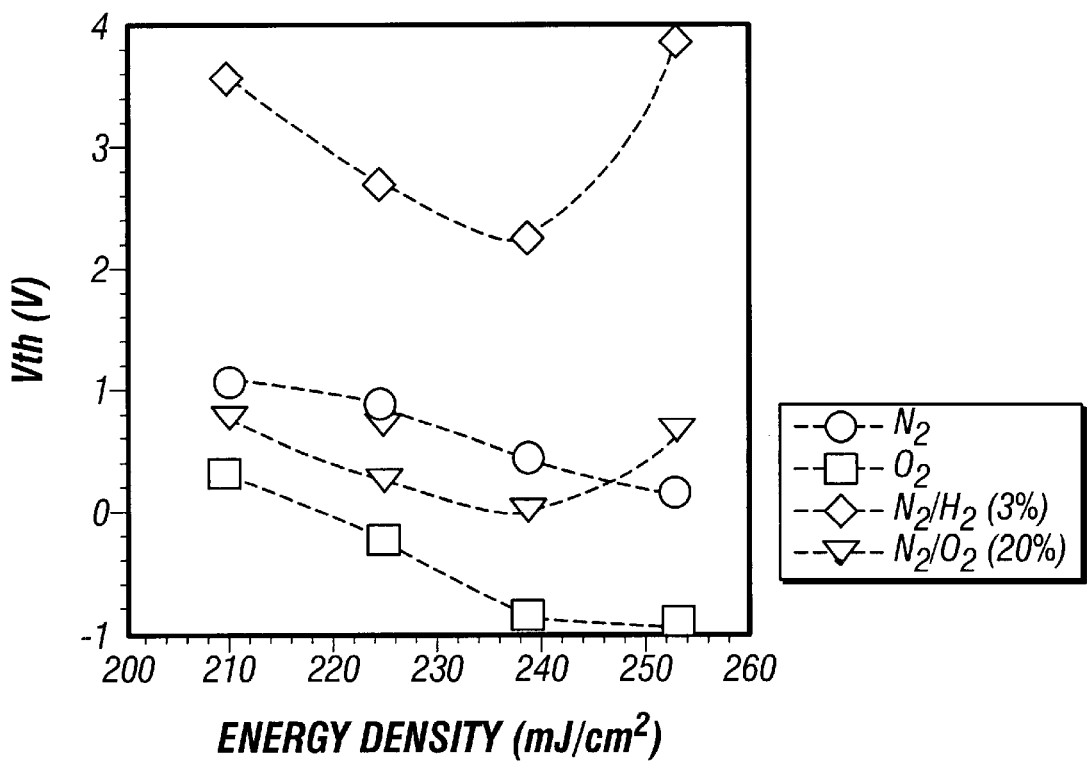
FIGS. 4A and 4B show how the threshold voltage (Vth) depends on the atmosphere and the laser beam energy density in the first embodiment.
Figure 4B:
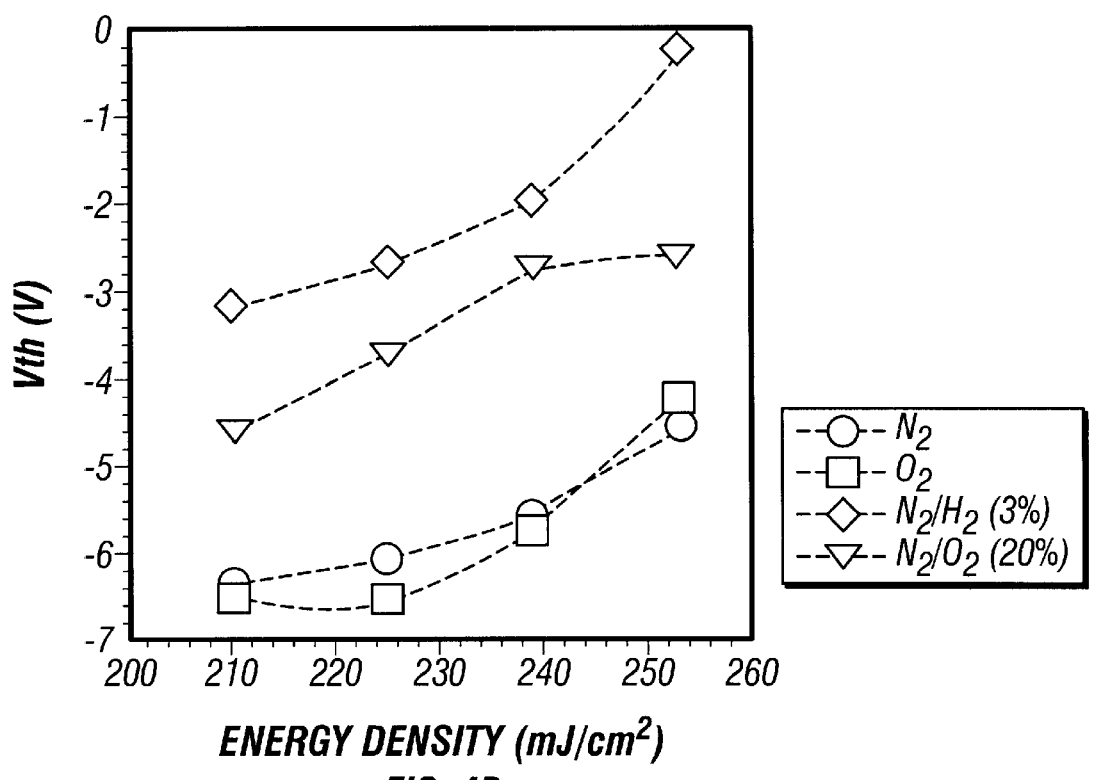

FIGS. 4A and 4B show how the threshold voltage (Vth) depends on the atmosphere and the laser beam energy density in n-channel TFTs and p-channel TFTs, respectively. In FIGS. 4A and 4B, symbol "◇" represents a crystalline silicon film for TFTs which was formed in the above-described hydrogen-inclusive atmosphere $N_2/H_2$ (3%), symbol "○" represents a crystalline silicon film that was formed in a 100%-$N_2$ atmosphere, symbol "□" represents a crystalline silicon film that was formed in a 100%-$O_2$ atmosphere, and symbol "▽" represents a crystalline silicon film that was formed in an atmosphere $N_2/O_2$ (20%). The purity of each gas was 99.99999% (7 Ns), and the pressure was set at the atmospheric pressure.

It is seen from FIGS. 4A and 4B that the threshold voltages (Vth) of both n-channel and p-channel TFTs that were formed in the hydrogen-inclusive atmosphere are considerably shifted to the positive side from those of the TFTs that were formed in the other atmospheres. That is, by performing laser annealing in a hydrogen-inclusive atmosphere, the threshold voltage can be shifted to the positive side and the normally-on state can be obtained even without performing the threshold voltage control such as boron doping.

Figure 5A:
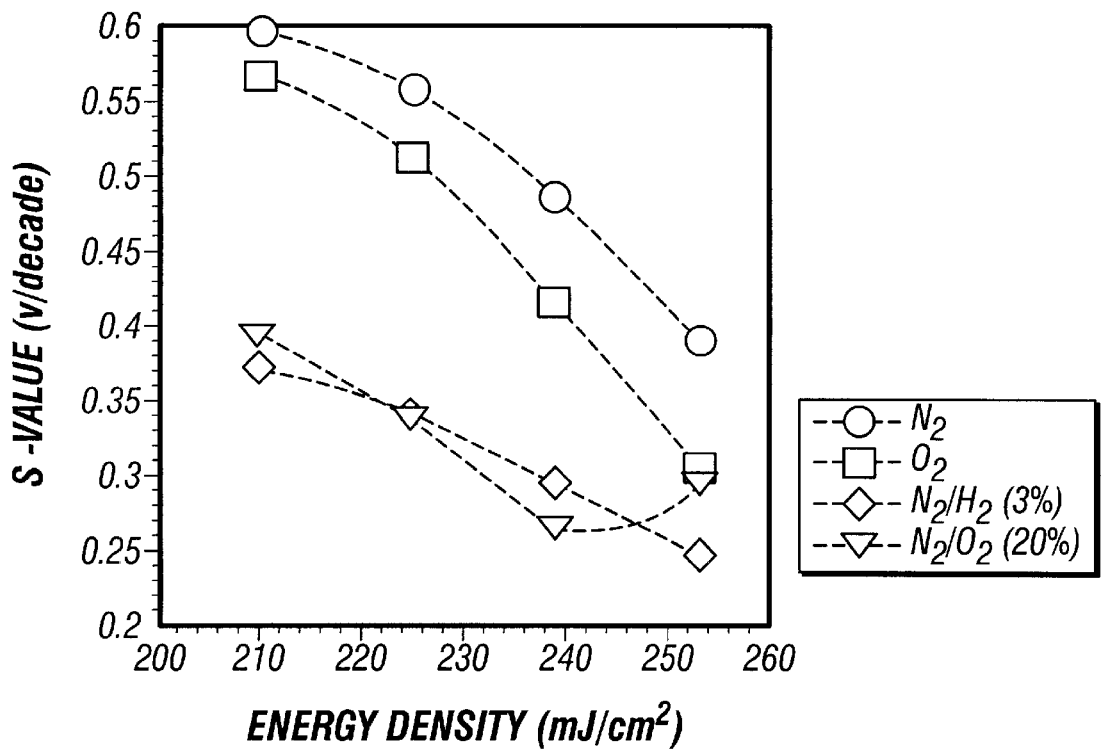
FIGS. 5A and 5B show how the S-value depends on the atmosphere and the laser beam energy density in the first embodiment.
Figure 5B:
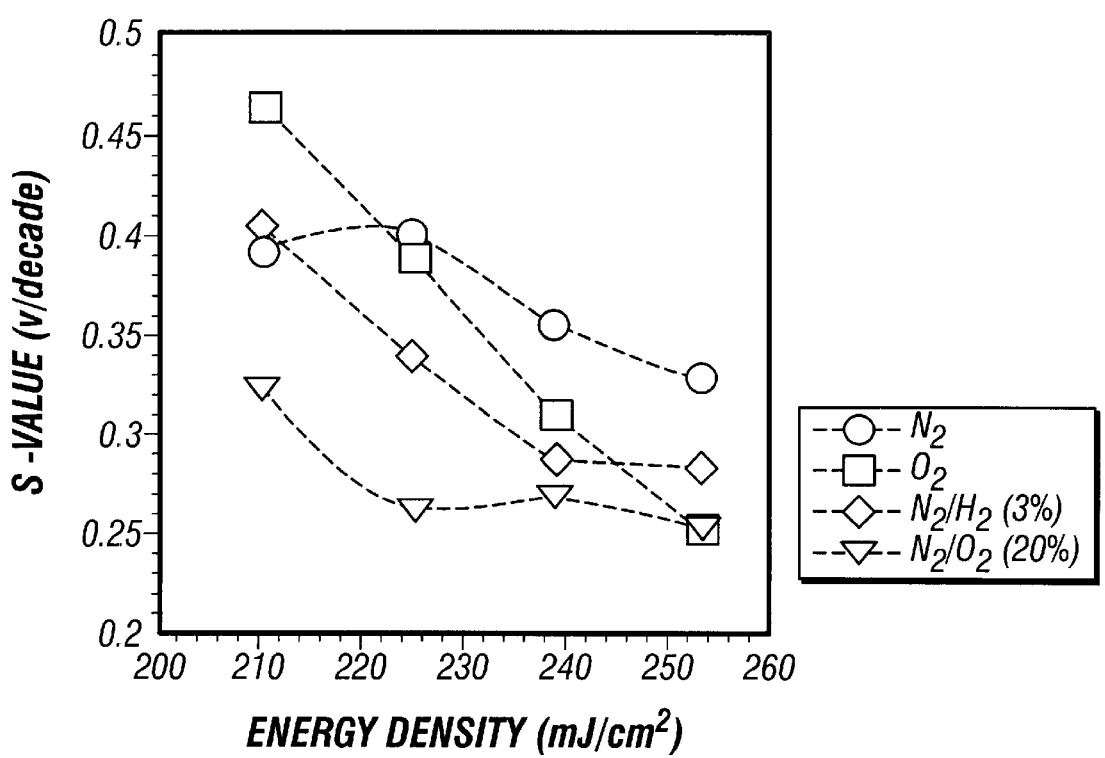

FIGS. 5A and 5B show how the S-value depends on the atmosphere and the laser beam energy density in n-channel TFTs and p-channel TFTs, respectively. The symbols used in FIGS. 4A and 4B which represent the respective atmospheres in which a crystalline silicon film for TFTs was formed are also used in FIGS. 5A and 5B.

While the threshold voltages of the TFTs formed in the hydrogen-inclusive atmosphere were shifted to the positive side as seen from FIGS. 4A and 4B, the S-values did not increase as seen from FIGS. 5A and 5B. Therefore, the TFTs formed in the hydrogen-inclusive atmosphere should exhibit a superior current rising characteristic at the time of switching.

Embodiment 2

In this embodiment, the hydrogen content in the atmosphere is set at 0.5%, which is smaller than in the first embodiment. A crystalline silicon film was formed with the other conditions set the same as in the first embodiment.

TFTs formed by using the above crystalline silicon film had almost the same S-values as in the TFTs formed according to the first embodiment. Although a positive shift in threshold voltage was smaller than in the first embodiment, the threshold voltage was shifted to the positive side from the conventional case where the laser annealing was performed in an air atmosphere. It is concluded that the amount of a shift in threshold voltage can be controlled by the hydrogen content of a laser annealing atmosphere.

Embodiment 3

Figure 8:
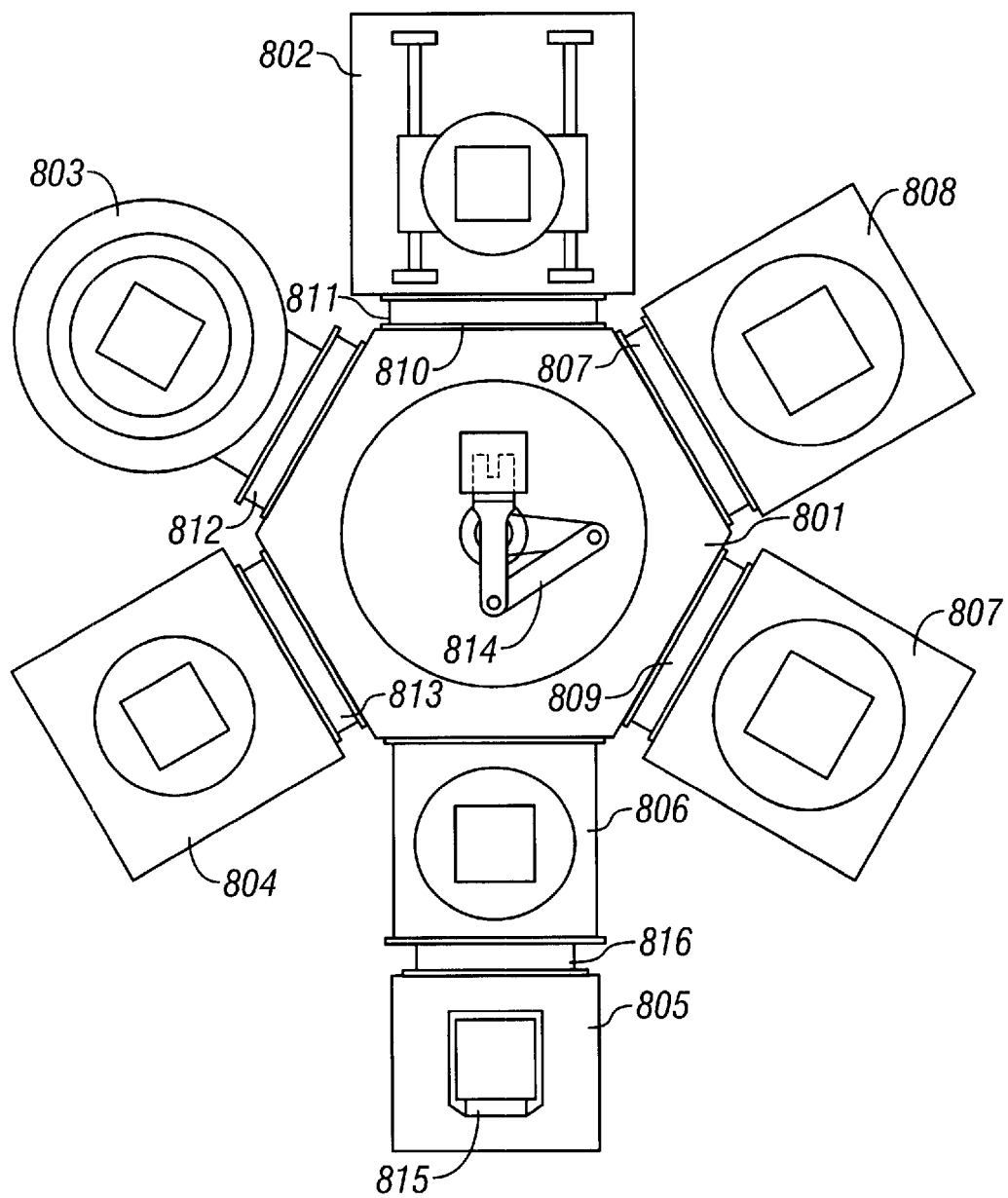
FIG. 8 is a top view of a consecutive processing apparatus according to a third to sixth embodiments of the invention.

This embodiment is directed to a consecutive processing apparatus used in a fourth embodiment onward of the invention. FIG. 8 is a top view of a consecutive processing apparatus according to this embodiment, in which two plasma processing chambers are added to the apparatus of FIG. 3. By using this apparatus, a gate insulating film can be formed immediately subsequent to a laser annealing step in a hydrogen-inclusive atmosphere.

As shown in FIG. 8, a laser irradiation chamber 802, a preliminary heating chamber 803, a slow cooling chamber 804, a first plasma processing chamber 807, and a second plasma processing chamber 808 are connected to a substrate transfer chamber 801 via respective valves is 809 to 813. Further, a load/unload chamber 805 is connected to the substrate transfer chamber 801 via an alignment chamber 806 and a gate valve 816.

A robot arm 814 as a substrate transfer means is provided in the substrate transfer chamber 801. The load/unload chamber 805 is provided with a cassette 815 for accommodating a plurality of substrates.

Among the components of the apparatus of FIG. 8, the substrate transfer chamber 801, the laser irradiation chamber 802, the preliminary heating chamber 803, the slow cooling chamber 804, the load/unload chamber 805, and the alignment chamber 806 are constructed in the same manner as in the apparatus of FIG. 3 (described in the first embodiment) and hence are not described here.

In FIG. 8, each of the first and second plasma processing chambers 807 and 808 is a known plasma processing apparatus which has a high-frequency electric field generating means (not shown) and a pair of parallel plate electrodes (not shown) connected thereto, and which can perform various kinds of plasma processing by forming a plasma atmosphere above a substrate. A substrate to be processed is mounted on one of the parallel plate electrodes.

Provided with a gas supply means and an evacuation means (both not shown), each of the first and second plasma processing chambers 807 and 808 can control the atmosphere and the pressure in the chamber.

In each processing chamber 807 or 808, a gas that is introduced into the chamber from the gas supply means is activated by an electric field that develops between the electrodes, whereby plasma processing such as film formation, nitrifying, or oxidation can be performed on the top surface of a substrate.

In the apparatus of FIG. 8, airtightness is secured in each chamber and between the adjacent chambers. The atmosphere in each chamber can be controlled as desired. Substrates that are processed by this apparatus can be isolated from the external atmosphere, that is, can be prevented from contacting with the air.

With this apparatus, a step of laser-annealing a crystalline silicon film in a hydrogen-inclusive atmosphere and a step of forming a film to become a gate insulating film can be performed consecutively without exposing the crystalline silicon film to the air between those steps.

Embodiment 4

This embodiment is directed to a process in which laser annealing on a crystalline silicon film in a hydrogen-inclusive atmosphere and formation of a gate insulating film are performed consecutively.

Figure 6A:
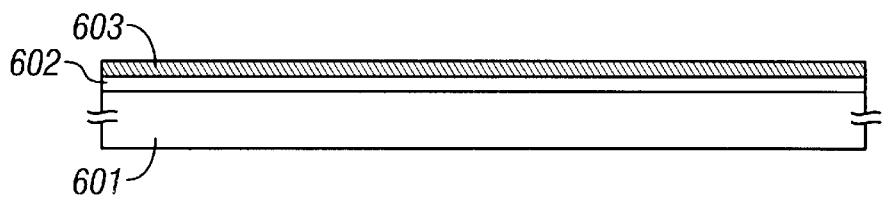
FIGS. 6A to 6F show a manufacturing process according to a fourth or fifth embodiment of the invention.

FIGS. 6A to 6F show a manufacturing process of a thin-film transistor according to this embodiment. In the same manner as in the first embodiment, a silicon oxide film 602 as an undercoat film and an amorphous silicon film are consecutively formed on a substrate 601 such as a Corning 1737 substrate through plasma CVD. After a nickel acetate aqueous solution is applied to the amorphous silicon film, thermal annealing is performed at 600° C. for 4 hours to form a crystalline silicon film 603. (FIG. 6A)

An island-like region 604 is then formed by etching the crystalline silicon film 603 by a known method.

Thereafter, by using the apparatus of FIG. 8, a step of laser-annealing the island-like region 604 on the substrate 601 in a hydrogen-inclusive atmosphere and a step of forming a film to become a gate insulating film are performed consecutively in the following manner.

In this embodiment, a nitrogen atmosphere is established in the substrate transfer chamber 801 shown in FIG. 8.

First, the substrate 601 formed with the island-like region 604 is cleaned with a HF aqueous solution or an aqueous solution of HF and $H_2O_2$ so that a native oxide film is removed. The substrate 601 is then set in the cassette 815, which is then placed into the load/unload chamber 805.

Referring to FIG. 8, in this embodiment, the substrate 601 that has been subjected to alignment is directly transferred to the laser irradiation chamber 802 without being transferred to the preliminary heating chamber 803 to prevent oxidation due to exposure to the air in the chamber 803. However, it is effective to heat the substrate 601 in the preliminary heating chamber 803 to such a degree that its top surface is not oxidized. The heating in the preliminary heating chamber 803 may be performed in a non-oxidizing atmosphere such as a nitrogen atmosphere.

After the laser irradiation chamber 802 is evacuated, hydrogen and nitrogen are introduced into the chamber 802 to provide an atmosphere consisting of hydrogen of 3% and nitrogen of 97%. In this embodiment, the purity of each of hydrogen and nitrogen that are introduced into the laser irradiation chamber 101 is 99.99999% (7 Ns).

Figure 6B:
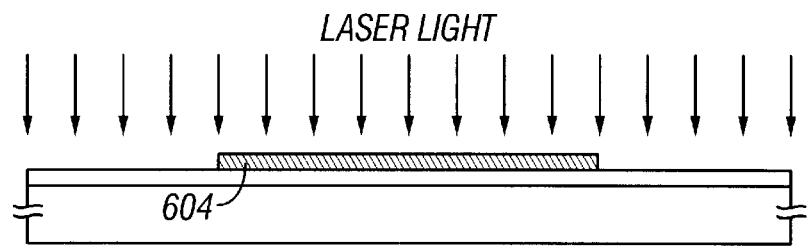

The pressure is set at the atmospheric pressure. Thereafter, laser annealing is performed on the island-like region 604 in the hydrogen-inclusive atmosphere under the same conditions as in the first embodiment, so that the crystallinity of the island-like region 604 is improved. (FIG. 6B)

The substrate 601 is then transferred to the slow cooling chamber 804, and gradually cooled therein. This slow cooling step is performed when necessary.

A gate insulating is then formed in the following manner by using, in this embodiment, a multi-layer film consisting of a silicon oxynitride (SiON) film and a silicon nitride (SiN) film.

After completion of the slow cooling, the substrate 601 as output from the slow cooling chamber 804 is directly transferred to the first processing chamber 807 without being exposed to the air. Consecutively with the laser annealing step, a first gate insulating film is formed in the following manner in the first processing chamber 807.

First, in the first processing chamber 807, a silicon oxynitride (SiON) film as a first gate insulating film 606 is formed on the substrate 601 at a thickness of 200 to 2,000 Å, for instance, about 1,500 Å, through plasma CVD by using material gases of a TEOS gas and a $N_2O$ gas, for instance. The substrate temperature is maintained at 400° C.

Then, the substrate 601 is transferred to the second processing chamber 808, where a silicon nitride (SiN) film as a second gate insulating film 607 is formed at a thickness of 250 to 1,000 Å, for instance, about 500 Å, by plasma CVD by using material gases of silane and ammonia, for instance. The substrate temperature is set at 300° C.

After being gradually cooled in the slow cooling chamber 804 when necessary, the substrate 601 is stored into the cassette 815 in the load/unload chamber 805. The cassette 815 is then taken out of the chamber 805.

Figure 6C:
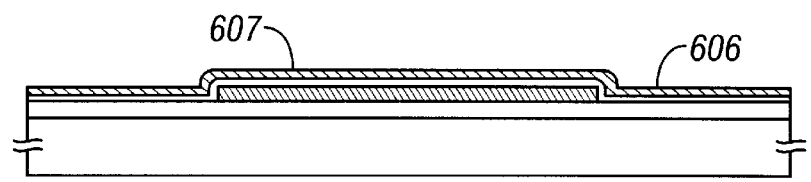

In the above manner, according to the multi-chamber scheme, the laser annealing step and the gate insulating film forming step are performed consecutively without exposing the crystalline silicon film to the air. (FIG. 6C)

Next, a gate electrode is formed. That is, an aluminum film is deposited next sputtering at a thickness of 3,000 to 8,000 Å, for instance, 6,000 Å. To prevent occurrence of hillocks, silicon may be added to the aluminum film at 0.1% to 2%. The aluminum film is then etched into a gate electrode 608.

Then, phosphorus ions or boron ions are implanted into the island-like region 604 through ion doping with the gate electrode 608 used as a mask. The substrate temperature is maintained at the room temperature.

Figure 6D:
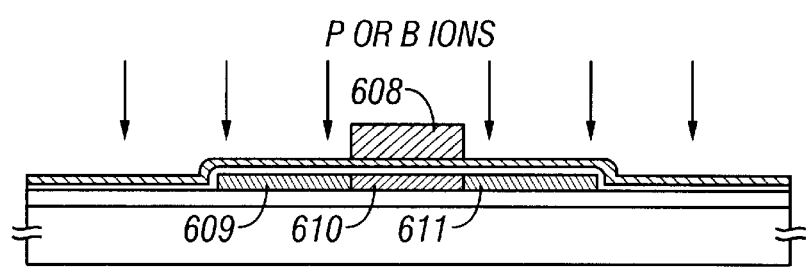

As a result, a channel forming region 610 and p-type impurity regions, i.e., a source 608 and a drain 609 are formed. (FIG. 6D)

Figure 6E:
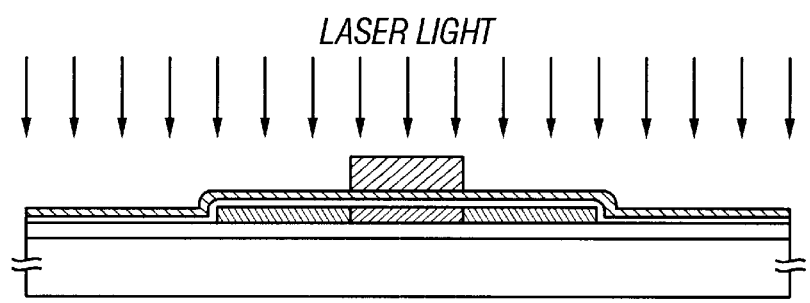

Next, to activate the doped impurities, laser annealing is performed under the same conditions as in the first embodiment. Thermal annealing is then performed at 450° C. for 2 hours in a nitrogen atmosphere. (FIG. 6E)

Figure 6F:
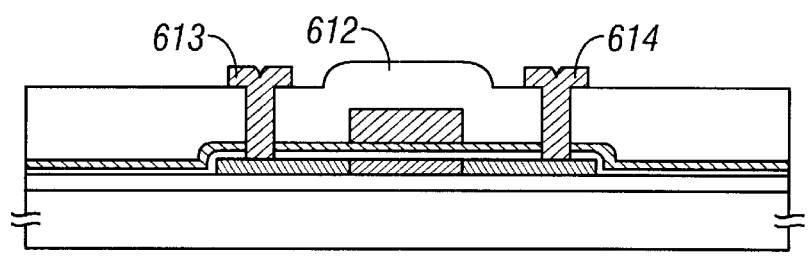

Thereafter, an interlayer insulating film 612, a source electrode/wiring line 613, and a drain electrode/wiring line 614 are formed in the same manner as in the first embodiment. Finally, thermal annealing is performed at 2000 to 350° C. in a hydrogen atmosphere of 1 atm, to complete a thin-film transistor. (FIG. 6F)

Thin-film transistors produced according to this embodiment showed positive threshold voltage shifts of 3 to 5 V, which are larger than those produced according to the first embodiment while exhibited smaller S-values than the latter. Further, a slight increase in mobility was obtained.

Further, because of the two-layer gate insulating film consisting of the silicon oxynitride film and the silicon nitride film, the breakdown voltage was increased from the case of using only a silicon nitride film.

In this embodiment, the gate insulating film may be constituted only of a silicon oxide film as in the case of the first embodiment. In this case, although the threshold voltage shift is larger than in the first embodiment, no marked improvements are obtained in the S-value and mobility.

Embodiment 5

This embodiment is directed to a manufacturing process of a thin-film transistor which is different from that of the fourth embodiment only in that the gate insulating film consists of a silicon oxide ($SiO_2$) film (first insulating film) and a silicon nitride (SiN) film (second insulating film). This embodiment will be described below with reference to FIGS. 6 and 8.

First, an island-like region 601 of an amorphous silicon film is formed on a substrate 601 by the same steps as in the fourth embodiment. Then, by using the apparatus of FIG. 8, laser annealing is performed on the island-like region 604 on the substrate 601 in a hydrogen-inclusive atmosphere by the same steps and under the same conditions as in the fourth embodiment. (FIG. 6B)

Thereafter, the substrate 601 is transferred to the slow cooling chamber 804, and gradually cooled therein when necessary.

After completion of the slow cooling, the substrate 601 as output from the slow cooling chamber 804 is transferred to the first processing chamber 807 without being exposed to the air. Consecutively with the laser annealing step, a first gate insulating film is formed in the following manner in the first processing chamber 807.

First, in the first processing chamber 807, a silicon oxide ($SiO_2$) film as a first gate insulating film 606 is formed at a thickness of 1,000 to 4,000 Å, for instance, about 2,000 Å, through plasma CVD by using, for instance, a TEOS material gas.

Then, the substrate 601 is transferred to the second processing chamber 808, where a silicon nitride (SiN) film as a second gate insulating film 607 is formed at a thickness of about 1,000 Å through plasma CVD by using material gases of silane and ammonia, for instance. The substrate temperature is maintained at 300° C.

In the above manner, the laser annealing step and the gate insulating film forming step are performed consecutively. As a result, formation of an oxide film and introduction of impurities at the boundary between the gate insulating film and the island-like region 610 to become a channel forming region can be prevented, whereby the boundary is given superior characteristics. (FIG. 6C)

Thereafter, a thin-film transistor is completed in the same manner as in the fourth embodiment. (FIGS. 6D to 6F)

Compared to the thin-film transistors formed according to the first embodiment, thin-film transistors formed according to this embodiment exhibited an increase in threshold voltage shift, a decrease in S-value, and an increase in mobility.

Embodiment 6

This embodiment is directed to a process in which a first insulating film is a silicon nitride film formed by nitrifying the top surface of a crystalline silicon film. This embodiment is the same as the fourth embodiment except for the structure of the gate insulating film.

FIGS. 7A to 7F show a manufacturing process of a thin-film transistor according to this embodiment. In the same manner as in the fourth embodiment, a silicon oxide film as an undercoat film 702 and an amorphous silicon island-like region 704 are formed on a glass substrate 701, and then thermal crystallization is performed.

Figure 7A:
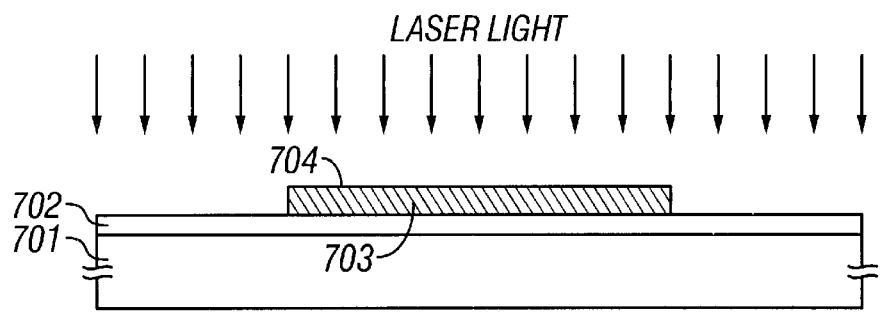
FIGS. 7A to 7F show a manufacturing process according to a sixth embodiment of the invention.

The crystallinity of the island-like region 704 is improved by performing laser annealing in a hydrogen-inclusive atmosphere in the laser irradiation chamber by using the consecutive processing apparatus of FIG. 8, that is, in the same manner as in the fourth embodiment. (FIG. 7A)

Thereafter, the substrate 701 is transferred to the slow cooling chamber 804, and gradually cooled therein when necessary.

After completion of the slow cooling, the substrate 701 as output from the slow cooling chamber 804 is transferred to the first processing chamber 807 without being exposed to the air. Consecutively with the laser annealing step, a first gate insulating film 706 is formed in the following manner in the first processing chamber 807.

First, ammonia ($NH_3$) and nitrogen ($N_2$) are introduced into the first processing chamber 807, and a plasma atmosphere including activated ammonia ($NH_3^*$) is generated by a high-frequency electric field.

Figure 7B:
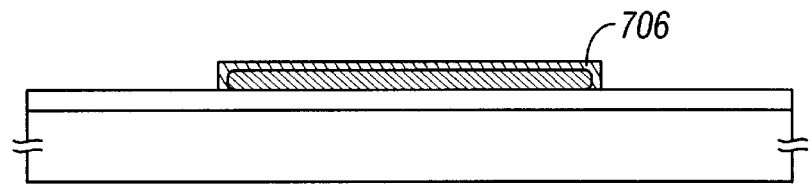

By exposing the island-like region 704 to the plasma atmosphere, the surface of the island-like region 704 is nitrified, that is, a silicon nitride (SiN) film as a first gate insulating film 706 is formed at a thickness of 50 to 300 Å, for instance, about 100 Å. The substrate temperature is maintained at 300° to 400° C., for instance, 350° C. (FIG. 7B)

Figure 7C:
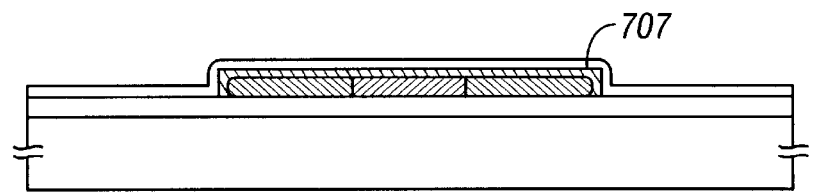
Figure 7D:
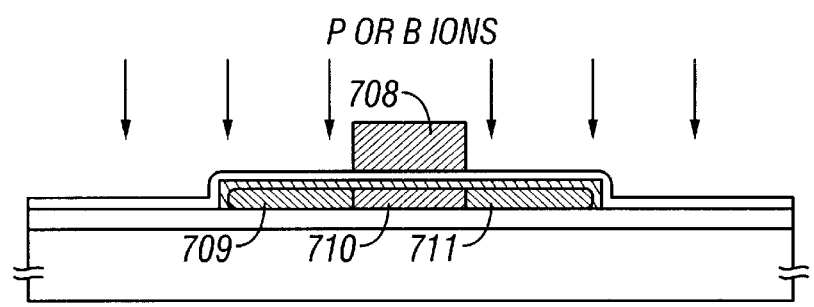
Figure 7E:
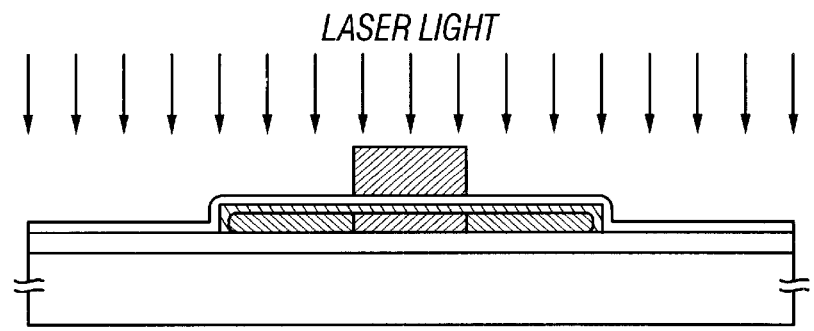
Figure 7F:
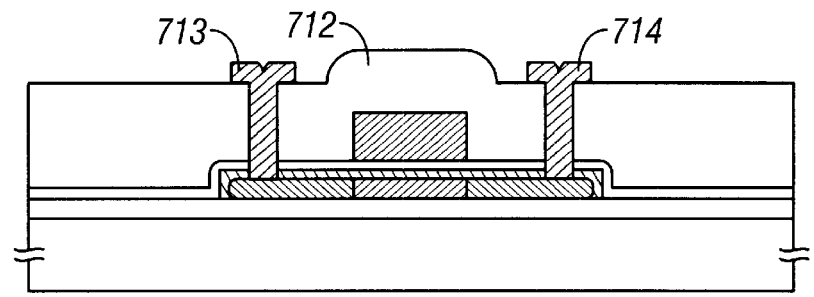

Then, the substrate 701 is transferred to the second processing chamber 808, where a silicon nitride film as a second gate insulating film 707 is formed, immediately after formation of the first gate insulating film 706, at a thickness of about 200 to 1,000 Å, for instance, about 300 Å, through plasma CVD by using material gases of silane and ammonia, for instance. The substrate temperature is maintained at 300° C. (FIG. 7C)

Thereafter, a thin-film transistor is completed in the same manner as in the fourth embodiment. (FIGS. 7D to 7F) Resulting thin-film transistors are given a boundary between the channel forming region and the gate insulating film which boundary has excellent characteristics. As a result, even compared to the thin-film transistors formed according to the fourth embodiment, thin-film transistors formed according to this embodiment exhibited an increase in threshold voltage shift, a decrease in S-value, and an increase in mobility.

It is considered that the above advantages are obtained by virtue of a higher degree of hydrogen confinement in the channel forming region and creation of a better boundary, which result from the fact that the silicon nitride first gate insulating film 706 is obtained by nitrifying the surface of the island-like region 704, than in the case of laying a first gate insulating film by film formation.

In particular, because of the use of the $NH_3^*$ atmosphere as a nitrifying atmosphere, hydrogen is introduced into the island-like region 704 when its surface is nitrified. It is considered that the existence of hydrogen accelerates the threshold voltage shift, the neutralization of dangling bonds, and other preferable phenomena.

Although in the above embodiments the amorphous silicon film is crystallized by the combination of the thermal crystallization step and the laser annealing step, it may be crystallized only by a laser annealing step.

According to the invention, by using laser annealing, a non-single-crystal silicon film is crystallized or improved in crystallinity, as well as the threshold voltage of TFTs formed by using a resulting crystalline silicon film can be shifted to the positive side without increasing the S-value. That is, TFTs having a steep current rising characteristic at the time of switching and exhibiting a normally-off state can be obtained without increasing the number of manufacturing steps, in contrast to the conventional threshold value control by boron doping. Therefore, the manufacturing cost can be reduced.

Further, the laser annealing step in a hydrogen-inclusive atmosphere and the gate insulating film forming step can be performed consecutively, i.e., without exposing a crystalline silicon film to the air between those steps. As a result, the characteristics of the boundary between the channel forming region and the gate insulating film of a TFT can be improved, resulting in further improvements in threshold voltage shift and S-value.

What is claimed is:

1. A manufacturing method of a semiconductor device, comprising:

forming a semiconductor film comprising silicon over a substrate;

forming at least one semiconductor island by patterning said semiconductor film;

scanning said at least one semiconductor island over said substrate, with a pulsed linear laser beam having an elongated cross section and a fixed oscillation frequency by moving the substrate in a direction perpendicular to an elongation direction of said cross section at a fixed speed in an atmosphere comprising a mixture gas of hydrogen and at least one gas selected from a group consisting of air, nitrogen, helium, and argon in a first chamber of an apparatus; and then forming an insulating film comprising at least silicon and nitrogen on said semiconductor island in a second chamber of said apparatus, and wherein said at least one semiconductor island is not exposed to the air outside of the apparatus between said scanning step and said forming step.

2. A method according to claim 1 wherein said hydrogen is contained in said mixture gas at a concentration of 0.1% to 3%.

3. A method according to claim 1 wherein said scanning said at least one semiconductor island is conducted at an atmospheric pressure.

4. A method according to claim 1 wherein said scanning said at least one semiconductor island is conducted at a pressure of 0.01 to 700 Torr.

5. A method according to claim 1 wherein an energy density of said laser beam on a surface of said at least one semiconductor island is set at 100 to 500 mJ/cm$^2$.

6. A method according to claim 1 wherein said substrate is heated at a temperature of 100–700° C. during said scanning said at least one semiconductor island.

7. A method according to claim 1 further comprising:
heating said semiconductor island before said scanning said at least one semiconductor island.

8. A method according to claim 1, wherein said fixed oscillation frequency is 200 Hz and said fixed speed is 2.5 mm/s.

9. A method according to claim 1, wherein said semiconductor device is a monolithic type display device in which a pixel region and driver circuits are formed on said substrate.

10. A method according to claim 1, wherein a width of said laser beam is 0.34 mm.

11. The manufacturing method of claim 1, wherein scanning said at least one semiconductor island comprises irradiating each point of the semiconductor island with 10 to 50 pulses of the laser beam sufficient to cause laser annealing of the semiconductor island.

12. A manufacturing method of a semiconductor device, comprising:

forming a semiconductor film comprising silicon over a substrate;

forming at least one semiconductor island by patterning said semiconductor film;

scanning said at least one semiconductor island comprising silicon over said substrate, with a pulsed linear laser beam having an elongated cross section and a fixed oscillation frequency by moving the substrate in a direction perpendicular to an elongation direction of said cross section at a fixed speed in in an atmosphere comprising a mixture gas of hydrogen and at least one gas selected from a group consisting of air, nitrogen, helium, and argon in a first chamber in an apparatus; and then forming a multilayer insulating film containing nitrogen on the semiconductor island in a second chamber in said apparatus, and wherein said at least one semiconductor island is not exposed to the air outside of the apparatus between said scanning step and said forming step.

13. A method according to claim 12 wherein said hydrogen is contained in said mixture gas at a concentration of 0.1% to 3%.

14. A method according to claim 12 wherein said scanning said at least one semiconductor island is conducted at an atmospheric pressure.

15. A method according to claim 12 wherein said scanning said at least one semiconductor island is conducted at a pressure of 0.01 to 700 Torr.

16. A method according to claim 12 wherein an energy density of said laser beam on a surface of said at least one semiconductor island is set at 100 to 500 mJ/cm$^2$.

17. A method according to claim 12 wherein said substrate is heated at a temperature of 100–700° C. during said scanning said at least one semiconductor island.

18. A method according to claim 12 wherein a width of said laser beam is 0.34 mm.

19. A method according to claim 12 wherein said at least one semiconductor island comprises a catalyst for promoting the crystallization of said semiconductor film at a concentration of $5 \times 10^{18}$ atoms/cm$^3$ or less.

20. A method according to claim 12, wherein said fixed oscillation frequency is 200 Hz, and said fixed speed is 2.5 mm/s.

21. A method according to claim 12, wherein said atmosphere consists of hydrogen 3% and nitrogen 97%.

22. A method according to claim 12, wherein said semiconductor device is a monolithic type display device in which a pixel region and driver circuits are formed on said substrate.

23. The manufacturing method of claim 12, wherein scanning said at least one semiconductor island comprises irradiating each point of the semiconductor island with 10 to 50 pulses of the laser beam sufficient to cause laser annealing of the semiconductor island.

24. A manufacturing method of a semiconductor device, comprising:

forming a semiconductor film comprising silicon over a substrate;

forming at least one semiconductor island by patterning said semiconductor film;

scanning said substrate having said at least one semiconductor island with a pulsed linear laser beam having an elongated cross section and a fixed oscillation frequency in an atmosphere comprising a mixture gas of hydrogen and at least one gas selected from a group consisting of air, nitrogen, helium, and argon in a first chamber of an apparatus by moving the substrate in a direction perpendicular to an elongation direction of said cross section at a fixed speed at an atmospheric pressure in a first chamber of an apparatus; and then forming an insulating film comprising at least silicon and nitrogen on said semiconductor island in a second chamber of said apparatus, and wherein said at least one semiconductor island is not exposed to the air outside of said apparatus between said scanning step and said forming step.

25. A method according to claim 24 further comprising:
introducing impurities in said at least one semiconductor island.

26. A method according to claim 24 wherein said hydrogen is contained in said mixture gas at a concentration of 0.1% to 3%.

27. A method according to claim 24 wherein an energy density of said laser beam on a surface of said semiconductor island is set at 100 to 500 mJ/cm$^2$.

28. A method according to claim 24 wherein said insulating film is formed by performing a thermal annealing.

29. A method according to claim 24 wherein said at least one semiconductor island comprises a catalyst for promoting the crystallization of said semiconductor film at a concentration of 5×10$^{18}$ atoms/cm$^3$ or less.

30. A method according to claim 24, wherein said fixed oscillation frequency is 200 Hz and said fixed speed is 2.5 mm/s.

31. A method according to claim 24, wherein said atmosphere consists of hydrogen 3% and nitrogen 97%.

32. A method according to claim 24, wherein said semiconductor device is a monolithic type display device in which a pixel region and driver circuits are formed on said substrate.

33. The manufacturing method of claim 24, wherein scanning said substrate having said semiconductor island comprises irradiating each point of the semiconductor island with 10 to 50 pulses of the laser beam sufficient to cause laser annealing of the semiconductor island.

34. A manufacturing method of a semiconductor device, comprising:

forming a semiconductor film comprising silicon over a substrate;

thermal annealing said semiconductor film;

forming at least one semiconductor island by patterning said semiconductor film;

scanning said substrate having said at least one semiconductor island with a pulsed linear laser beam having an elongated cross section in an atmosphere comprising a mixture gas of hydrogen and at least one gas selected from a group consisting of air, nitrogen, helium, and argon in a first chamber of an apparatus by moving the substrate in a direction perpendicular to an elongation direction of said cross section at a fixed speed and at an atmospheric pressure in a first chamber of an apparatus;

forming a gate insulating film comprising at least silicon and nitrogen on said semiconductor island in a second chamber of an apparatus; and then forming a gate electrode adjacent to said semiconductor island with said gate insulating film interposed therebetween; and introducing impurities in at least one portion of said semiconductor island, and wherein said at least one semiconductor island is not exposed to the air outside of said apparatus between said scanning and said forming said gate insulating film.

35. A method according to claim 34, wherein said semiconductor device is a monolithic type display device in which a pixel region and driver circuits are formed on said substrate.

36. A method according to claim 34 wherein said introducing impurities is conducted by ion doping method.

37. A method according to claim 34 further comprising:

scanning said substrate having said semiconductor island with said pulsed linear laser after said introducing impurities.

38. A method according to claim 37, wherein one point of said substrate is irradiated with 20 to 40 pulses of said laser beam, and an energy density of said laser beam on a surface of said semiconductor island is set at 100 to 350 mJ/cm$^2$.

39. A method according to claim 34 wherein an energy density of said pulsed linear laser beam on a surface of said semiconductor island is set at 100 to 500 mJ/cm$^2$.

40. A method according to claim 34 wherein said at least one semiconductor island comprises a catalyst for promoting the crystallization of said semiconductor film at a concentration of 5×10$^{18}$ atoms/cm$^3$ or less.

41. A method according to claim 34 wherein said gate insulating film is a multilayer film comprising a silicon oxynitride film and a silicon nitride film.

42. A method according to claim 34, wherein said hydrogen is contained in said mixture gas at a concentration of 0.1% to 3%.

43. A method according to claim 34, wherein said fixed speed is 2.5 mm/s and an oscillation frequency of said laser beam is 200 Hz.

44. The manufacturing method of claim 34, wherein scanning said substrate having said semiconductor island comprises irradiating each point of the semiconductor island with 10 to 50 pulses of the laser beam sufficient to cause laser annealing of the semiconductor island.

45. A manufacturing method of a semiconductor device, comprising:

forming at least one semiconductor film comprising silicon over a substrate;

scanning said at least one semiconductor film over said substrate, with a laser beam in an atmosphere comprising a mixture gas of hydrogen and at least one gas selected from a group consisting of air, nitrogen, helium, and argon in a first chamber of an apparatus; and then forming an insulating film comprising at least silicon and nitrogen on said at least one semiconductor film in a second chamber of said apparatus, and wherein said at least one semiconductor film is not exposed to the air outside between said scanning step and said forming step.

46. A method according to claim 45, wherein a laser oscillation frequency is 200 Hz and a scan speed is 2.5 mm/s.

47. A method according to claim 45, wherein said hydrogen is contained in said mixture gas at a concentration of 0.1% to 3%.

48. A method according to claim 45, wherein said semiconductor device is a monolithic type display device in which a pixel region and driver circuits are formed on said substrate.

49. The manufacturing method of claim 45, wherein scanning said semiconductor film over said substrate comprises irradiating each point of the semiconductor film with 10 to 50 pulses of the laser beam sufficient to cause laser annealing of the semiconductor film.

50. A manufacturing method of a semiconductor device, comprising:

forming a semiconductor film comprising silicon over a substrate;

thermal annealing said semiconductor film;

forming at least one semiconductor island by patterning said semiconductor film;

scanning said at least one semiconductor island comprising silicon over said substrate, with a pulsed linear laser beam having an elongated cross section and a fixed oscillation frequency in an atmosphere comprising a mixture gas of hydrogen and at least one gas selected from a group consisting of air, nitrogen, helium, and argon by moving the substrate in a direction perpendicular to an elongation direction of said cross section at a fixed speed in a first chamber of an apparatus; and then forming an insulating film comprising at least silicon and nitrogen on said semiconductor island in a second chamber of said apparatus, and wherein said scanning and said forming are consecutively performed without exposing to an air outside of the apparatus.

51. A method according to claim 50, wherein said fixed oscillation frequency is 200 Hz and said fixed speed is 2.5 mm/s.

52. A method according to claim 50, wherein said hydrogen is contained in said mixture gas at a concentration of 0.1% to 3%.

53. A method according to claim 50, wherein said semiconductor device is a monolithic type display device in which a pixel region and driver circuits are formed on said substrate.

54. The manufacturing method of claim 50, wherein scanning said semiconductor island comprises irradiating each point of the semiconductor island with 10 to 50 pulses of the laser beam sufficient to cause laser annealing of the semiconductor island.

55. A method of manufacturing a semiconductor device, comprising:

forming a semiconductor film comprising silicon over a substrate;

crystallizing said semiconductor film by thermal annealing;

forming at least one semiconductor island by patterning said crystallized semiconductor film;

scanning said substrate and said semiconductor island with a pulsed linear laser beam having an elongated cross section in an atmosphere comprising a mixture gas of hydrogen and at least one gas selected from a group consisting of air, nitrogen, helium, and argon by moving the substrate in a direction perpendicular to an elongation direction of said cross section at a fixed speed at an atmospheric pressure in said first chamber; and then forming an insulating film comprising at least silicon and nitrogen on said at least one semiconductor island in a second chamber of an apparatus, and wherein said scanning step and said forming step are consecutively performed without exposing to an air outside of the apparatus.

56. A method according to claim 55, wherein an energy density of said laser beam on a surface of said at least one semiconductor island is set at 100 to 500 mJ/cm$^2$.

57. A method according to claim 55, said insulating film is formed by thermal annealing performed in a nitrogen atmosphere.

58. A method according to claim 55, wherein said fixed speed is 2.5 mm/s and an oscillation frequency of said laser beam is 200 Hz.

59. A method according to claim 55, wherein said semiconductor device is a monolithic type display device in which a pixel region and driver circuits are formed on said substrate.

60. A method according to claim 55, wherein said at least one semiconductor island comprises a catalyst for promoting the crystallization of said semiconductor film at a concentration of 5×10$^{18}$ atoms/cm$^3$ or less.

61. A method according to claim 55, wherein said hydrogen is contained in said mixture gas at a concentration of 0.1% to 3%.

62. The manufacturing method of claim 55, wherein scanning said substrate and said semiconductor island comprises irradiating each point of the substrate and the semiconductor island with 10 to 50 pulses of the laser beam sufficient to cause laser annealing of the semiconductor island.

63. A method of manufacturing a semiconductor device, comprising:

forming at least one semiconductor film comprising silicon over a substrate;

crystallizing said at least one semiconductor film by thermal annealing;

scanning said substrate and said at least one semiconductor film with a linear laser beam in an atmosphere comprising a mixture gas of hydrogen and at least one gas selected from a group consisting of air, nitrogen, helium, and argon in said first chamber; and then treating said at least one semiconductor film with nitrogen in a second chamber of the apparatus, and wherein said scanning and said treating are consecutively performed without exposing to an air outside of the apparatus.

64. A method according to claim 63, wherein an energy density of said laser beam on a surface of said at least one semiconductor film is set at 100 to 500 mJ/cm$^2$.

65. A method according to claim 63, wherein said at least one semiconductor film comprises a catalyst for promoting the crystallization of said semiconductor film at a concentration of 5×10$^{18}$ atoms/cm$^3$ or less.

66. A method according to claim 63, wherein said semiconductor device is a monolithic type display device in which a pixel region and driver circuits are formed on said substrate.

67. A method according to claim 63, wherein said hydrogen is contained in said mixture gas at a concentration of 0.1% to 3%.

68. The manufacturing method of claim 63, wherein scanning said substrate and said at least one semiconductor film comprises irradiating each point of the substrate and at least one semiconductor film with 10 to 50 pulses of the laser beam sufficient to cause laser annealing of the semiconductor film.

69. A method of manufacturing a semiconductor device, comprising:

forming a semiconductor film comprising silicon over a substrate;

crystallizing said semiconductor film by thermal annealing;

forming at least one semiconductor island by patterning said crystallized semiconductor film;

scanning said substrate and said at least one semiconductor island with a pulsed linear laser beat having an elongated cross section in an atmosphere comprising a mixture gas of hydrogen and at least one gas selected from a group consisting of air, nitrogen, helium, and argon by moving the substrate in a direction perpendicular to an elongation direction of said cross section at a fixed speed at an atmospheric pressure in said first chamber;

forming a gate insulating film on said at least one semiconductor island by treating a surface of said semiconductor island with nitrogen in a second chamber of the apparatus, and then forming a gate electrode adjacent to said semiconductor island with a gate insulating film comprising at least silicon and nitrogen interposed therebetween; and introducing impurities in at least one portion of said semiconductor island, and wherein said scanning step and said treating step are consecutively performed without exposing to an air outside of the apparatus.

70. A method according to claim 69, wherein said semiconductor device is a monolithic type display device in which a pixel region and driver circuits are formed on said substrate.

71. A method according to claim 69, wherein an energy density of said laser beam on a surface of said at least one semiconductor island is set at 100 to 500 mJ/cm$^2$.

72. A method according to claim 69, further comprising:
scanning said substrate having said at least one semiconductor island with said pulsed linear laser after said introducing impurities.

73. The manufacturing method of claim 69, wherein scanning said substrate and said semiconductor island comprises irradiating each point of the substrate and semiconductor island with 10 to 50 pulses of the laser beam sufficient to cause laser annealing of the semiconductor island.

74. A method according to claim 69, wherein said semiconductor island comprises a catalyst for promoting the crystallization of said semiconductor film at a concentration of $5\times10^{18}$ atoms/cm$^3$ or less.

75. A method according to claim 69, wherein said hydrogen is contained in said mixture gas at a concentration of 0.1% to 3%.

* * * * *